US008785784B1

(12) United States Patent
Duford et al.

(10) Patent No.: US 8,785,784 B1
(45) Date of Patent: Jul. 22, 2014

(54) METHODS AND APPARATUS FOR OPTIMIZING STRUCTURAL LAYOUT OF MULTI-CIRCUIT LAMINATED COMPOSITE ASSEMBLY

(71) Applicant: Boulder Wind Power, Inc., Louisville, CO (US)

(72) Inventors: James D. Duford, Polson, MT (US); James D. Jore, Polson, MT (US); Lincoln M. Jore, Ronan, MT (US); James S. Smith, Lyons, CO (US)

(73) Assignee: Boulder Wind Power, Inc., Louisville, CO (US)

( * ) Notice: Subject to any disclaimer, the term of this patent is extended or adjusted under 35 U.S.C. 154(b) by 0 days.

(21) Appl. No.: 13/799,998

(22) Filed: Mar. 13, 2013

(51) Int. Cl.
*H05K 1/03* (2006.01)
*H05K 1/02* (2006.01)

(52) U.S. Cl.
CPC .................................... *H05K 1/02* (2013.01)
USPC .......................... 174/255; 174/262; 310/68 R

(58) Field of Classification Search
None
See application file for complete search history.

(56) References Cited

U.S. PATENT DOCUMENTS 5,172,472 A 12/1992 Lindner et al.
5,365,424 A 11/1994 Deam et al.
5,428,327 A 6/1995 Bahl
5,579,217 A 11/1996 Deam et al.
5,619,085 A 4/1997 Shramo
5,856,636 A * 1/1999 Sanso .......................... 174/255
5,928,757 A 7/1999 Shinada et al.
6,141,885 A 11/2000 Ishitani et al.
6,229,124 B1 5/2001 Trucco
6,310,387 B1 10/2001 Seefeldt et al.
6,333,857 B1 * 12/2001 Kanbe et al. .................. 361/792
6,538,538 B2 3/2003 Hreish et al.
6,574,108 B1 6/2003 Kramer et al.
6,593,838 B2 7/2003 Yue
6,713,685 B1 3/2004 Cotton
6,820,321 B2 11/2004 Harding
6,833,603 B1 12/2004 Park et al.
6,836,036 B2 12/2004 Dube (Continued)

FOREIGN PATENT DOCUMENTS

EP 1732011 12/2006
TW 200830967 A 7/2008

OTHER PUBLICATIONS

"High Speed Layout Design Guidelines," Freescale Semiconductor Application Note, Document No. AN2536, Rev. 2, Apr. 2006, 26 pgs.

(Continued)

*Primary Examiner* — Ishwarbhai B Patel
(74) *Attorney, Agent, or Firm* — Cooley LLP

(57) ABSTRACT

A laminated composite assembly includes a layer having a first conductor with a first side and a second side. A first electric insulator is disposed between the first side of the first conductor and a second conductor such that a difference between a voltage associated with the first conductor and a voltage associated with the second conductor defines a voltage stress therebetween. The first electric insulator providing a first degree of electrical isolation based on the voltage stress. A second electric insulator is disposed between the second side of the first conductor and a third conductor such that a difference between the voltage associated with the first conductor and a voltage associated with the third conductor defines a second voltage stress therebetween. The second electric insulator providing a second degree of electrical isolation based on the second voltage stress.

22 Claims, 8 Drawing Sheets

110
150
170
150
170
150
120
$T_1$
120
$T_2$
120

(56) References Cited

U.S. PATENT DOCUMENTS

| | | | | |
|---|---|---|---|---|
| 6,848,912 | B2 | 2/2005 | Zhang | |
| 6,923,552 | B2 | 8/2005 | Tseng et al. | |
| 7,061,133 | B1 | 6/2006 | Leijon et al. | |
| 7,109,625 | B1 * | 9/2006 | Jore et al. | 310/198 |
| 7,112,910 | B2 * | 9/2006 | Lopatinsky et al. | 310/268 |
| 7,135,952 | B2 | 11/2006 | Harding | |
| 7,463,122 | B2 | 12/2008 | Kushta et al. | |
| 7,557,423 | B2 | 7/2009 | Ching et al. | |
| 7,602,272 | B2 | 10/2009 | Whittaker et al. | |
| 7,615,709 | B2 | 11/2009 | Goergen | |
| 7,648,900 | B2 | 1/2010 | Kirby | |
| 7,710,234 | B2 | 5/2010 | Gardner et al. | |
| 7,863,724 | B2 | 1/2011 | Douriet et al. | |
| 7,977,237 | B2 | 7/2011 | Feustel et al. | |
| 7,979,983 | B2 | 7/2011 | Bird et al. | |
| 8,022,532 | B2 | 9/2011 | Kasuya et al. | |
| 8,031,033 | B2 | 10/2011 | Mansell et al. | |
| 8,089,331 | B2 | 1/2012 | Jacobson et al. | |
| 8,110,749 | B2 | 2/2012 | Yoshimura et al. | |
| 8,129,625 | B2 | 3/2012 | Kato | |
| 8,167,629 | B2 | 5/2012 | Ito et al. | |
| 2001/0032388 | A1 | 10/2001 | Morris | |
| 2004/0150490 | A1 | 8/2004 | Smith et al. | |
| 2006/0099801 | A1 | 5/2006 | Cramer et al. | |
| 2007/0125574 | A1 * | 6/2007 | Kim et al. | 174/260 |
| 2007/0158105 | A1 * | 7/2007 | Kitao et al. | 174/261 |
| 2007/0205018 | A1 * | 9/2007 | Koyama | 174/260 |
| 2009/0272566 | A1 | 11/2009 | Nomiya et al. | |
| 2010/0032195 | A1 | 2/2010 | Hayashi | |
| 2010/0085717 | A1 | 4/2010 | Sweeney et al. | |
| 2010/0308939 | A1 | 12/2010 | Kurs | |
| 2011/0273048 | A1 | 11/2011 | Jore et al. | |
| 2012/0080797 | A1 | 4/2012 | Daubenspeck et al. | |
| 2012/0097436 | A1 | 4/2012 | Lai et al. | |
| 2012/0206132 | A1 | 8/2012 | Lepage | |

OTHER PUBLICATIONS

Qpedia-2010, "Understanding and Optimizing Thermal Vias," Guenin B, 2010, <URL:http://qats.com/epanel/UploadedPdf/Qpedia_Thermal_eMagazine_0510_V3_lorez.pdf>.

Kubik et al., "Kubik-2006" PCB racetrack fluxgate sensor with improved temperature stability, Czech Technical University in Prague, Faculty of Electrical Engineering, Technicka 2, CZ-16627 Praha 6, Czech Republic, 2006 http://www.sciencedirect.com/science/article/pii/S0924424705007624.pdf.

Gambetta et al., "Designing Printed Circuit Stators for Brushless Permanent Magnet Motors," 2009, URL:http:eprints.usq.edu.au/6491/3/Gambetta_Ahfock_IET_2009_AV.pdf.

* cited by examiner

METHODS AND APPARATUS FOR OPTIMIZING STRUCTURAL LAYOUT OF MULTI-CIRCUIT LAMINATED COMPOSITE ASSEMBLY

BACKGROUND

The embodiments described herein relate generally to laminated composite assemblies containing electrical circuits and more particularly to methods and apparatus for optimizing structural layout of multi-circuit printed circuit boards.

Some known laminated composite assemblies (e.g., printed circuit boards) include multiple layers of selectively etched copper separated by a substantially uniform core material and/or dielectric material. The conductive layers of copper carry electrical current from, or induced by, an electrical source to electronic devices in electrical communication with the conductive layers. For example, in some instances, the conductive layers of a printed circuit board can receive a flow of electrical current from a power source such as a battery, inverter, or power outlet. Such printed circuit boards can receive and/or transmit a flow of electrical current in a single phase.

In other instances, an electrical current can be induced on or along the conductive layers of a laminated composite assembly, such as, for example, by permanent magnets included in an electromagnetic machine. In some instances, the phase of the electrical current carried on the conductive layers of the laminated composite assembly can be varied between the layers. In such instances, the dielectric layers of the laminated composite assembly are sufficiently thick to substantially prevent current from flowing between each conductive layer carrying a different voltage. However, in some instances, the dielectric thickness can increase cost, weight, impedance, reluctance, or the like. Moreover, the thickness of the dielectric layers can increase the overall thickness of the laminated composite assembly beyond the limitations of available space.

In some instances, it is desirable to electrically connect more than one conductor of a laminated composite assembly. In some instances, external connections (e.g., bus bars) are often coupled to the conductors of the laminated circuit boards. In such embodiments, the external interconnections can increase the cost, complexity, weight, etc. of the laminated composite assembly and/or the electrical or electromagnetic device within which they are disposed.

Thus, a need exists for improved methods and apparatus for optimizing a structural layout of a multi-circuit laminated composite assembly.

SUMMARY

In some embodiments, a laminated composite assembly includes a layer having a first conductor having a first side and a second side, opposite the first side. A first electric insulator is disposed between the first side of the first conductor and a second conductor such that a difference between a voltage associated with the first conductor and a voltage associated with the second conductor defines a voltage stress between the first conductor and the second conductor. The first electric insulator provides a first degree of electrical isolation between the first conductor and the second conductor based on the voltage stress between the first conductor and the second conductor. A second electric insulator is disposed between the second side of the first conductor and a third conductor such that a difference between the voltage associated with the first conductor and a voltage associated with the third conductor defines a voltage stress between the first conductor and the third conductor. The second electric insulator provides a second degree of electrical isolation between the first conductor and the third conductor based on the voltage stress between the first conductor and the third conductor.

DETAILED DESCRIPTION

Figure 1:
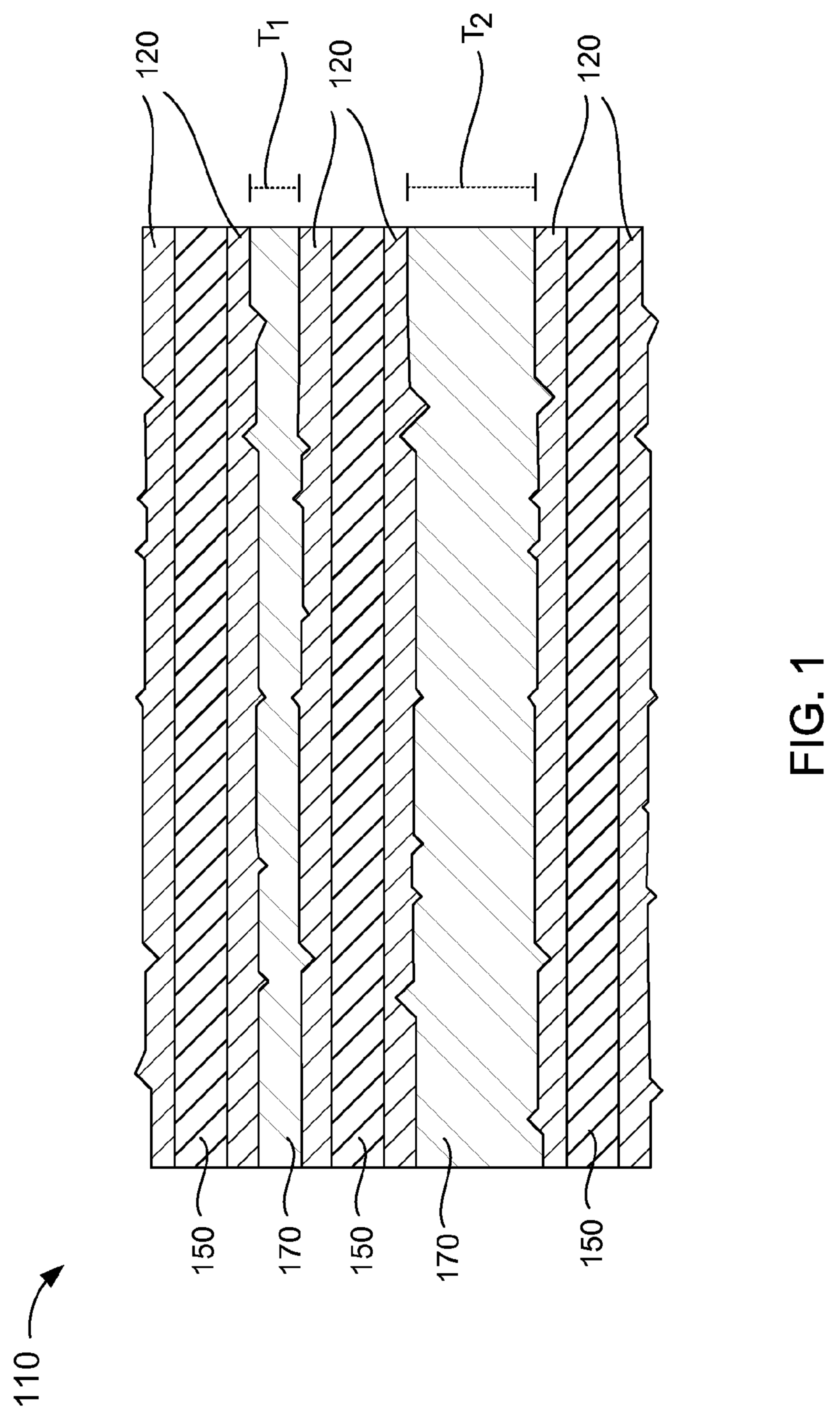
FIG. 1 is a schematic cross-sectional illustration of a laminated composite assembly according to an embodiment.

In some embodiments, a laminated composite assembly includes a layer having a first conductor having a first side and a second side, opposite the first side. A first electric insulator is disposed between the first side of the first conductor and a second conductor such that a difference between a voltage associated with the first conductor and a voltage associated with the second conductor defines a voltage stress between the first conductor and the second conductor. The first electric insulator provides a first degree of electrical isolation between the first conductor and the second conductor based on the voltage stress between the first conductor and the second conductor. A second electric insulator is disposed between the second side of the first conductor and a third conductor such that a difference between the voltage associated with the first conductor and a voltage associated with the third conductor defines a voltage stress between the first conductor and the third conductor. The second electric insulator provides a second degree of electrical isolation between the first conductor and the third conductor based on the voltage stress between the first conductor and the third conductor.

In some embodiments, a laminated composite assembly includes a first set of layers and a second set of layers. Each layer from the first set of layers has a conductor associated with a first electrical circuit and each layer from the second set of layers has a conductor associated with a second electrical circuit. The laminated composite assembly includes a first electric insulator that provides a first degree of electrical isolation between the conductor of a first layer from the first set of layers and the conductor of a second layer from the first set of layers. The laminated composite assembly includes a second electric insulator that provides a second degree of electrical isolation between the conductor of a third layer from the first set of layers and the conductor of a layer from the second set of layers. The second degree of electric isolation is different from the first degree of electric isolation.

In some embodiments, a first machine coil, being at least one electrical path on a laminated composite assembly, and a second machine coil, being at least one electrical path on the laminated composite assembly, are associated with a phase of a multi-phase set of machine windings. An internal connection, being at least one electrical path on the laminated composite assembly, electrically couples the first machine coil and the second machine coil.

In some instances, the embodiments described herein can be used in electromagnetic machines and/or components such as those found in wind power generators or other suitable generators and/or motors. In such instances, the electromagnetic machines described can be various types of permanent magnet machines, including axial flux machines, radial flux machines, transverse flux machines, and/or linear machines, in which one component rotates about an axis or translates along an axis, either in a single direction or in two directions (e.g., reciprocating, with respect to another component). Such electromagnetic machines typically include windings to carry electric current through coils that interact with a flow of magnetic flux from one or more magnets through relative movement between the magnets and the windings. In a common industrial application arrangement (including the embodiments described herein), permanent magnets are mounted for movement (e.g., on a rotor or otherwise moving part) and the windings are mounted on a stationary part (e.g., on a stator or the like).

As used in this specification, the term "voltage stress" refers to a difference in voltage between a first conductor and a second conductor. Thus, a smaller difference in voltage between a first conductor and a second conductor is associated with a smaller voltage stress than a voltage stress associated with a larger difference in voltage between the first conductor and a third conductor. Moreover, the voltage stress (e.g., the voltage difference) can be sufficiently large that electrical current can flow and/or arc from one conductor (e.g., the conductor associated with the higher voltage) to another conductor (e.g., the conductor associated with the lower voltage). Therefore, in an effort to minimize undesired current flow and/or arc, an insulating material can be disposed between adjacent conductors.

As used herein, the term "dielectric strength" refers to a maximum electric field strength per unit thickness that can be applied to a dielectric or insulating material without the material substantially breaking down. Similarly stated, the dielectric strength of a material refers to the maximum strength of an electric field that can be applied to the material without a failure of the insulating properties of the material, measured in volts per meter V/m or a fraction thereof (e.g., kilovolts per millimeter (kV/mm), megavolts per millimeter (MV/mm), etc.). Dielectric strength is an intrinsic property, meaning the dielectric strength is inherent in a given material. However, external factors can alter a material's molecular and/or atomic structure and thus can alter the dielectric strength of the material. For example, operating temperature, sample thickness, and/or voltage frequency can alter the dielectric strength of a material. Therefore, the selection of a dielectric material as an insulator can be based, at least partially on the dielectric strength of the dielectric material.

As used herein, the singular forms "a," "an" and "the" include plural referents unless the context clearly dictates otherwise. Thus, for example, the term "a coil" is intended to mean a single coil or a combination of coils, "a material" is intended to mean one or more materials, or a combination thereof.

FIG. 1 is a schematic cross-sectional illustration of a laminated composite assembly 110 according to an embodiment. As described in detail herein, the laminated composite assembly 110 can be used to support a portion of an electronic circuit. For example, at least a portion of the laminated composite assembly 110 (also referred to herein as "assembly") can form a portion of an integrated circuit (IC), a printed circuit board (PCB), a PCB assembly, an application-specific integrated circuit (ASIC), or any other suitable electronic circuit support structure. The assembly 110 can include any suitable number of conducting layers that are separated by an electric insulator configured to limit an electromagnetic interference between the conducting layers.

As shown in FIG. 1, the assembly 110 includes multiple layers of conductors 120 that are separated by an electric insulator (e.g., a non-core dielectric layer 170 or a core 150). The core 150 can form a base that supports and/or separates a first layer of conductors 120 (e.g., disposed on a first side of the core 150) from a second layer of conductors (e.g., disposed on a second side of the core 150, opposite the first side). The core 150 can be, for example, a dielectric material that can selectively isolate (e.g., selectively prevent and/or limit electrical communication between) each of the one or more conducting layers. In some embodiments, the core 150 can be a dielectric material such as, for example, FR-4 or the like. In other embodiments, the core 150 can be formed from any suitable insulating material(s) such as, for example, fiberglass, cotton, or silicon and can be bound by any suitable resin material. In some embodiments, the non-core dielectric layer 170 disposed between the conductors 120 can be formed from a material that is substantially similar to, or the same as, the core 150. In some embodiments, the non-core dielectric layer 170 can be formed from a material (i.e., a pre-preg material) that can be heated to flow into the space between conductors 120 and allowed to cool and/or cure to form a substantially rigid (e.g., hardened) non-core dielectric layer 170. Therefore, in some embodiments, the assembly 110 can be a PCB including multiple conducting layers separated by electrically insulating layers (i.e., not necessarily formed from pre-manufactured, independent, or otherwise pre-defined PCBs). In other embodiments, the non-core dielectric layer 170 can be a different insulating material than the core 150. In some embodiments, the non-core dielectric layer 170 and/or the core 150 of the assembly 110 can be varied. For example, a first insulating layer can be formed from a first dielectric material and a second insulating layer can be formed from a second dielectric material, as described in further detail herein.

The conductors 120 can be, for example, conductive traces etched from a conductive sheet laminated to the core 150. More specifically, a conductive sheet on one or more outer surfaces of a core 150 can be masked and the undesired portions of the conductive sheet can be etched away, thereby leaving the desired conductive traces. The conductors 120 can be any suitable material such as, for example, copper, silver, aluminum, gold, zinc, tin, tungsten, graphite, conductive polymer, and/or any other suitable conductive material. In this manner, the conductors 120 can carry a current (e.g., associated with power distribution, a signal carrying information and/or induced by a magnetic source) along a length of the conductors 120. In some embodiments, the conductors 120 can be shielding conductors (e.g., electrically coupled to an electric ground).

As described in further detail herein, one of the conductors 120 disposed on a first layer of the assembly 110 can be placed in electrical communication with one of the conductors 120 disposed on a second layer of the assembly 110 by any suitable electrical interconnect (not shown in FIG. 1). For example, in some embodiments, a first conductive layer can be placed in electrical communication with a second conductive layer by one or more electrical interconnects (e.g., vias or holes defined by the assembly 110 and/or a PCB having a conductive portion such as an annulus) such as those described in U.S. patent application Ser. No. 13/778,415, filed on Feb. 27, 2013 and entitled "Methods and Apparatus for Optimizing Electrical Interconnects on Laminated Composite Assemblies," the disclosure of which is incorporated herein by reference in its entirety. In such embodiments, the electrical interconnects can be blind vias, through hole vias, buried vias, and/or the like In some embodiments, conductors 120 disposed on a layer of the assembly 110 can be placed in electrical communication by one or more internal connections (e.g., internal bus bars such as, for example, one or more conductive traces, electrical couplers, and/or pads).

In some embodiments, a first conductive layer can be a first machine coil (e.g., a conductor 120 arranged in a coil of non-intersecting electrical paths or traces) and a second conductive layer can be a second machine coil. In such embodiments, the assembly 110 can be included in, for example, a segmented stator assembly of an electromagnetic machine such as a generator or motor. Thus, a rotor having one or more magnets (e.g., permanent magnets) can be moved relative to the stator to induce an electric field (i.e., a voltage) in or on the first machine coil and/or the second machine coil. In some embodiments, the first machine coil can be placed in electrical communication with the second machine coil by an internal bus bar, an end turn (not shown in FIG. 1) and/or one or more vias. In some embodiments, the internal bus bar and/or the end turn can be disposed on a third layer of the assembly 110, different from the first layer and the second layer. In other embodiments, the internal bus bar and/or the end turn can be disposed on the first layer or the second layer. In still other embodiments, the internal bus bar can be disposed on the third layer and the end turn can be disposed on a fourth layer.

In some embodiments, a voltage associated with the conductors 120 can be varied between conductive layers. For example, in some embodiments, a first conductor 120 disposed on a first layer of the assembly 110 can have a first voltage and a second conductor 120 disposed on a second layer of the assembly 110 can have a second voltage, different from the first voltage. In such embodiments, the difference in voltage between the conductor 120 of the first layer and the conductor 120 of the second layer can define a voltage stress (defined above) between the conductor 120 of the first layer and the conductor 120 of the second layer. For example, in some instances, a larger difference in voltage between a first conductor 120 and a second conductor 120 can be associated with a larger voltage stress than a smaller difference in voltage between a third conductor 120 and a fourth conductor 120 (or other combination of conductors, for example, the first conductor 120 and the third conductor 120).

Accordingly, a degree of electrical isolation provided or defined by the electric insulators (e.g., the dielectric layer 170 and/or core 150) can be based, at least partially, on the designed or expected voltage stress between adjacent conductors 120. For example, as shown in FIG. 1, the non-core dielectric layer 170 having a first thickness $T_1$ is disposed between a first conductor 120 (e.g., second from the top in FIG. 1) and a second conductor 120 (e.g., third from the top in FIG. 1) that are associated with a first voltage stress while the non-core dielectric layer 170 having a second thickness $T_2$, greater than the first thickness $T_1$, is disposed between a third conductor 120 (e.g., fourth from the top in FIG. 1) and a fourth conductor 120 (e.g., fifth from the top in FIG. 1) that are associated with a second voltage stress, greater than the first voltage stress. Thus, when the non-core dielectric layers 170 are formed from the same material, the thickness $T_2$ of the non-core dielectric layer 170 provides a degree of electrical insulation sufficiently large to substantially electrically isolate the third conductor 120 from the fourth conductor 120.

Although the non-core dielectric layers 170 are shown in FIG. 1 as varying in thickness (e.g., $T_1$ and $T_2$), in other embodiments, the assembly 110 can include non-core dielectric layers of substantially equal thickness. For example, in some embodiments, the non-core dielectric layers 170 can have a substantially similar thickness while varying the dielectric strength (defined above) of the dielectric material. Similarly stated, the dielectric material forming the non-core dielectric layers 170 of the assembly 110 can be varied such that a degree of electric insulation associated with the dielectric material substantially corresponds to a voltage stress between a conductor 120 disposed on a first side of the non-core dielectric layer 170 and a conductor 120 disposed on a second side of the non-core dielectric layer 170. For example, in some embodiments, a first non-core dielectric layer can be formed from FR-4, having a dielectric strength of about 20 kilovolts per millimeter (kV/mm), and a second non-core dielectric layer can be formed from polytetrafluoroethylene (PTFE or commonly known as "Teflon"), having a dielectric strength of about 60 megavolts per millimeter (MV/mm). In this manner, the non-core dielectric layer formed from FR-4 and the non-core dielectric layer formed from PTFE can have a similar thickness, yet with varying dielectric strengths. Thus, by way of example, the non-core dielectric layer formed from FR-4 can be disposed between adjacent conductors defining a relatively smaller voltage stress, while the non-core dielectric layer formed from PTFE can be disposed between adjacent conductors defining a relatively larger voltage stress.

In some instances, a voltage stress can be associated with a difference in electrical phases being carried on adjacent conductors 120. In such instances, the thickness $T_1$ and $T_2$ of the non-core dielectric layers 170 can vary based, at least in part, on a difference in phases between the adjacent conductors 120. For example, in some instances, the assembly 110 can be included in a multi-phase electromagnetic machine. In such embodiments, the thickness of the non-core dielectric layer 170 disposed between adjacent conductors 120 carrying a current of the same phase can be less than the thickness of the non-core dielectric layer 170 disposed between adjacent conductors 120 carrying a current of different phases. Expanding further, the sinusoidal waveform of a voltage associated with a given phase that is carried on a conductor is substantially aligned with the sinusoidal waveform of a voltage associated with the phase that is carried on an adjacent conductor. Thus, with the rise and fall of the voltages being substantially aligned, the adjacent conductors can be disposed at a relatively close distance. Conversely, the sinusoidal waveform of a voltage associated with a first phase that is carried on a first conductor is not aligned with the sinusoidal waveform of a voltage associated with a second phase that is carried on a second conductor. Thus, the rise and fall of the voltages are not aligned and the first conductor and the second conductor are spaced a relatively larger distance than those voltages associated with similar phases. While the thickness of the non-core dielectric layer 170 is described as being variable, in some embodiments, the thickness of the core 150 can be varied (in addition to or instead of the non-core dielectric layer 170) based, at least in part, on a voltage stress defined between adjacent conductors 120.

Figure 2:
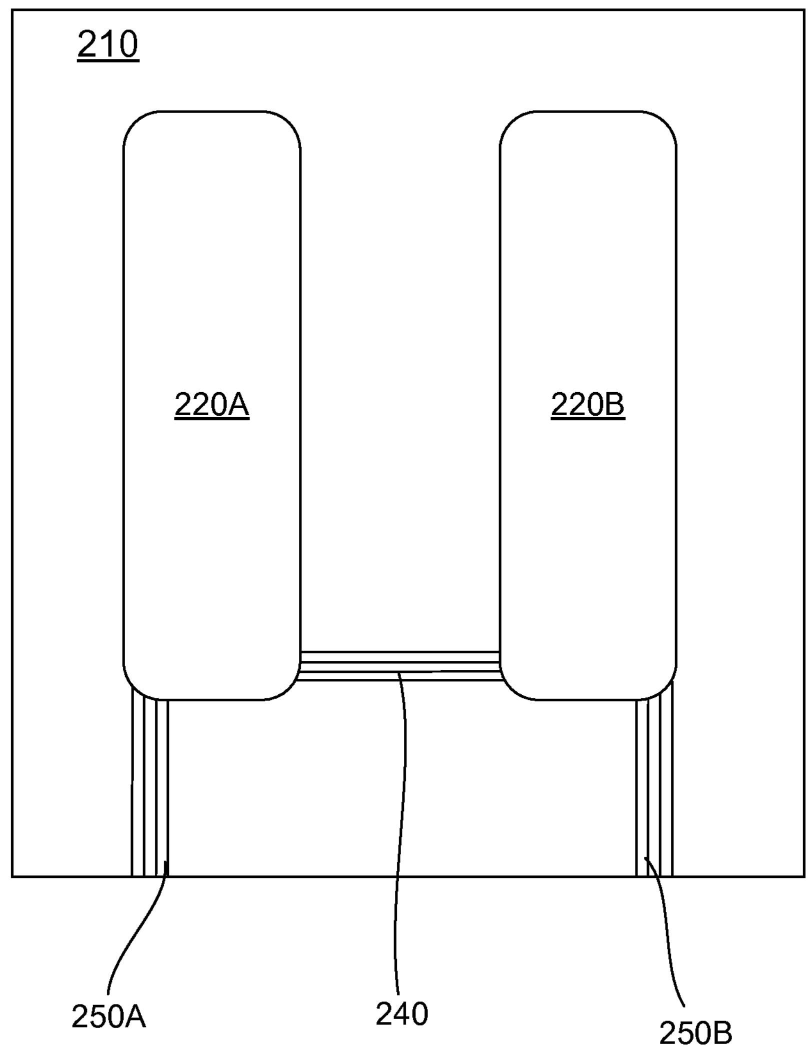
FIG. 2 is a schematic illustration of a laminated composite assembly according to an embodiment.

FIG. 2 is a schematic illustration of a laminated composite assembly 210 according to an embodiment. The laminated composite assembly 210 (also referred to herein as "assembly") can be included in an electromagnetic machine such as, for example, a generator or a motor. The assembly 210 includes a first machine coil 220A, a second machine coil 220B, an internal connection 240, a first terminal connection 250A, and a second terminal connection 250B. While not shown in FIG. 2, the assembly 210 can be formed from any number of conducting layers that are separated by a corresponding number of electrical insulating layers (e.g., non-core dielectric layers, cores, or pre-preg layers). The electrical insulating layers can be any suitable configuration. For example, the electrical insulating layers can be substantially similar to or the same as the non-core dielectric layers 170 and/or the cores 150, described above with reference to FIG. 1. Thus, the electrical insulating layers can provide a base for the conducting layers of the assembly 210 as well as provide a degree of electrical isolation between adjacent conducting layers.

The first machine coil 220A and the second machine coil 220B can be, for example, conductive traces etched from a conducting sheet of the assembly 210 (as described above). In some embodiments, the first machine coil 220A and the second machine coil 220B can be disposed on one or more layers of the assembly 210 and each can be arranged in coils of nonintersecting electrical paths or traces. In such embodiments, a first end portion of the first machine coil 220A can be electrically coupled to the first terminal connection 250A and a second end portion of the first machine coil 220A can be electrically coupled to the internal connection 240. Similarly, a first end portion of the second machine coil 220B can be electrically coupled to the internal connection 240 and a second end portion of the second machine coil 220B can be electrically coupled to the second terminal connection 250B.

The internal connection 240 can be any suitable configuration. For example, in some embodiments, the internal connection 240 can be an internal bus bar formed from one or more conductive traces. In such embodiments, the end portions of the internal connection 240 can be electrically coupled to one or more electrical pads configured to be coupled to the first machine coil 220A or the second machine coil 220B (as described above). The first terminal connection 250A and the second terminal connection 250B can be, for example, conductive traces configured to be coupled to the first machine coil 220A or the second machine coil 220B and further coupled to an external electrical connector (e.g., a connection device or portion of an electromagnetic machine). More specifically, in some embodiments, the first terminal connection 250A can be associated with, for example, a positive phase sector and the second terminal connection 250B can be associated with, for example, a negative phase sector. In some embodiments, the first terminal connection 250A and the second terminal connection 250B can be associated with a power distribution conductor.

Although the first machine coil 220A, the second machine coil 220B, the internal connection 240, the first terminal connection 250A, and the second terminal connection 250B are shown as being disposed on the same layer, in other embodiments, the conducting portions of the assembly 210 can be arranged in any suitable configuration. For example, while the first machine coil 220A and the second machine coil 220B are described above as being disposed on the same layer, in other embodiments, the first machine coil 220A and the second machine coil 220B can be disposed on different layers. Moreover, the internal connection 240, the first terminal connection 250A, and the second terminal connection 250B can be disposed on any suitable layer. For example, in some embodiments, the first machine coil 220A can be disposed on a first layer, the internal connection 240 can be disposed on a second layer, and the first terminal connection 250A can be disposed on a third layer. In such embodiments, the assembly 210 can include a set of vias (not shown in FIG. 2) that electrically connect the first layer, the second layer, and the third layer. In a similar manner, the end portions of the second machine coil 220B can be electrically coupled to a set of vias to be placed in electrical communication with the electric interconnect 240 and/or the terminal connection 250B. In some embodiments, the first terminal connection 250A and the second terminal connection 250B can be disposed on the same layer to form, for example, a power distribution layer that can distribute a voltage and/or current carried on the first machine coil 220A and/or the second machine coil 220B, as described in further detail herein.

In some embodiments, portions of the first machine coil 220A and/or portions of the second machine coil 220B can be disposed on multiple layers. Similarly stated, an assembly 210 can include any number of layers that each include a portion of the machine coils 220A and/or 220B. For example, in some embodiments, a first portion of the first machine coil 220A (e.g., an operative portion or side portions) can be disposed on a first layer and a second portion of the first machine coil 220A (e.g., an end turn portion and/or a connection portion) can be disposed on a second layer. In such embodiments, the layers of the machine coils 220A and/or 220B can be electrically coupled by vias. In some embodiments, the layers of the first machine coil 220A can include a single layer with, for example, end turns that would otherwise overlap the internal connection 240, the first terminal connection 250A, and/or other portions of the first machine coil 220A. Thus, by including multiple layers of the first machine coil 220A and/or the second machine coil 220B, the current density of the assembly 210 can be increased. Moreover, with the internal connection 240 and the terminal connections 250A and 250B included on a layer (e.g., at least partially as conductive traces) of the assembly 210, external electrical connections can be reduced, thereby saving cost, weight, space, or the like.

Figure 3:
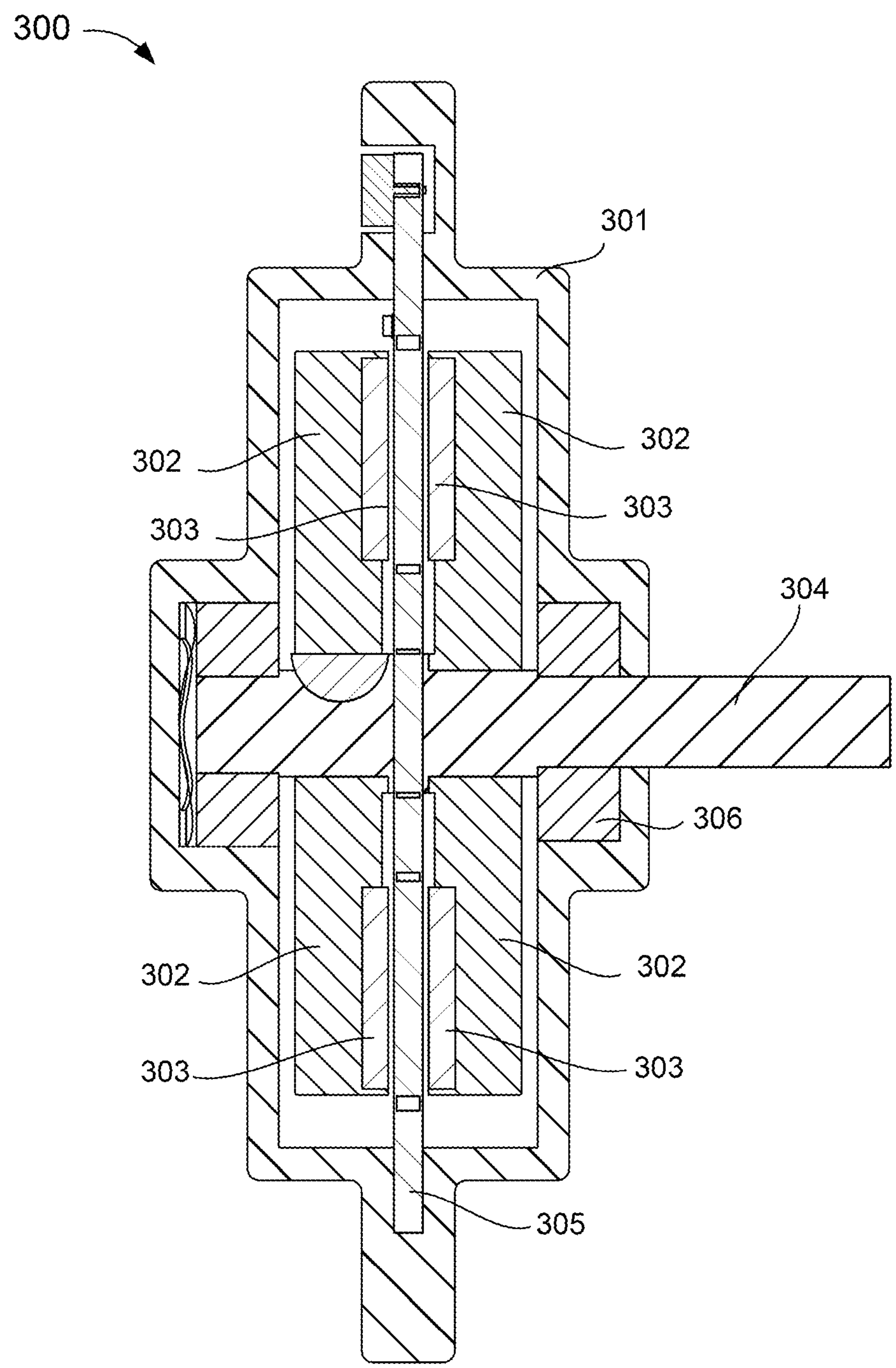
FIG. 3 is a schematic cross-sectional illustration of a laminated composite assembly used, for example, in a machine structure according to an embodiment.

Any of the embodiments described herein can be included in an electromagnetic machine such as, for example, a generator. For example, FIG. 3 is a cross-sectional illustration of a machine structure 300 according to an embodiment. The machine structure 300 can be disposed in an electromagnetic machine, such as, for example, an axial flux, radial flux, or transverse flux machine. In some embodiments, the machine structure 300 can be included in a wind turbine or the like.

The machine structure 300 includes a housing 301, a rotor assembly 302, and an annular stator assembly 305. The housing 301 substantially encloses the rotor assembly 302 and the stator assembly 305. The stator assembly 305 can be coupled to the housing 301 such that the stator assembly 305 remains in a substantially fixed position within the housing 301. The stator assembly 305 can include or support, for example, an air core type stator to support a set of conductive windings. For example, the stator assembly 305 can include any number of stator portions that can be substantially similar to stator portions described in U.S. Patent Application Publication No. 2011/0273048, the disclosure of which is incorporated herein by reference in its entirety. Each stator portion can include at least one laminated composite assembly (e.g., at least one PCB), such as, for example, those described herein. In some embodiments, the laminated composite assemblies can be similar to those described in U.S. Pat. No. 7,109,625, the disclosure of which is incorporated herein by reference in its entirety.

The rotor assembly 302 can include multiple rotor elements or portions that can be coupled together to form the rotor assembly 302. For example, in some embodiments, the rotor assembly 302 can include rotor portions similar to those described in U.S. patent application Ser. Nos. 13/568,791 and 13/152,164, the disclosures of which are incorporated herein by reference in their entireties. The rotor assembly 302 is coupled to a drive shaft 301 that is at least partially disposed within a set of bearings 306. Therefore, the drive shaft 304 can be rotated relative to the housing 301 (e.g., either directly or indirectly by a mechanical force). Moreover, with the rotator assembly 302 coupled to the drive shaft 304, the rotator assembly 302 is rotated with the drive shaft 304. Thus, the rotator assembly 302 can rotate relative to the stator assembly 305.

The rotor assembly 302 supports and/or is coupled to a set of magnetic assemblies 303. In some embodiments, the magnetic assemblies 304 can be similar to those described in U.S. patent application Ser. Nos. 13/692,083, 13/437,639, and 13/438,062, the disclosures of which are incorporated herein by reference in their entireties. In this manner, as the rotor assembly 302 is rotated relative to the stator assembly 305, a magnetic flux flows between the poles of the magnetic assemblies 303. Thus, an electric field is induced in or on the conductive windings of the stator assembly 305 (e.g., the conductive windings of the laminated composite assemblies such as, for example, the machine coils 220A and 220B described above with reference to FIG. 2) that when properly gathered and delivered allows the machine structure 300 to behave as a generator or alternator. Conversely, an application of an electrical current to the conductive material of the stator assembly 305 produces Lorentz forces between the flowing current and the magnetic field of the magnetic assemblies 303. The resultant force is a torque that rotates rotor assembly 302. Thus, the drive shaft 304 is rotated thereby doing work. In this manner, the machine structure 300 can behave as a motor or actuator.

Figure 4:
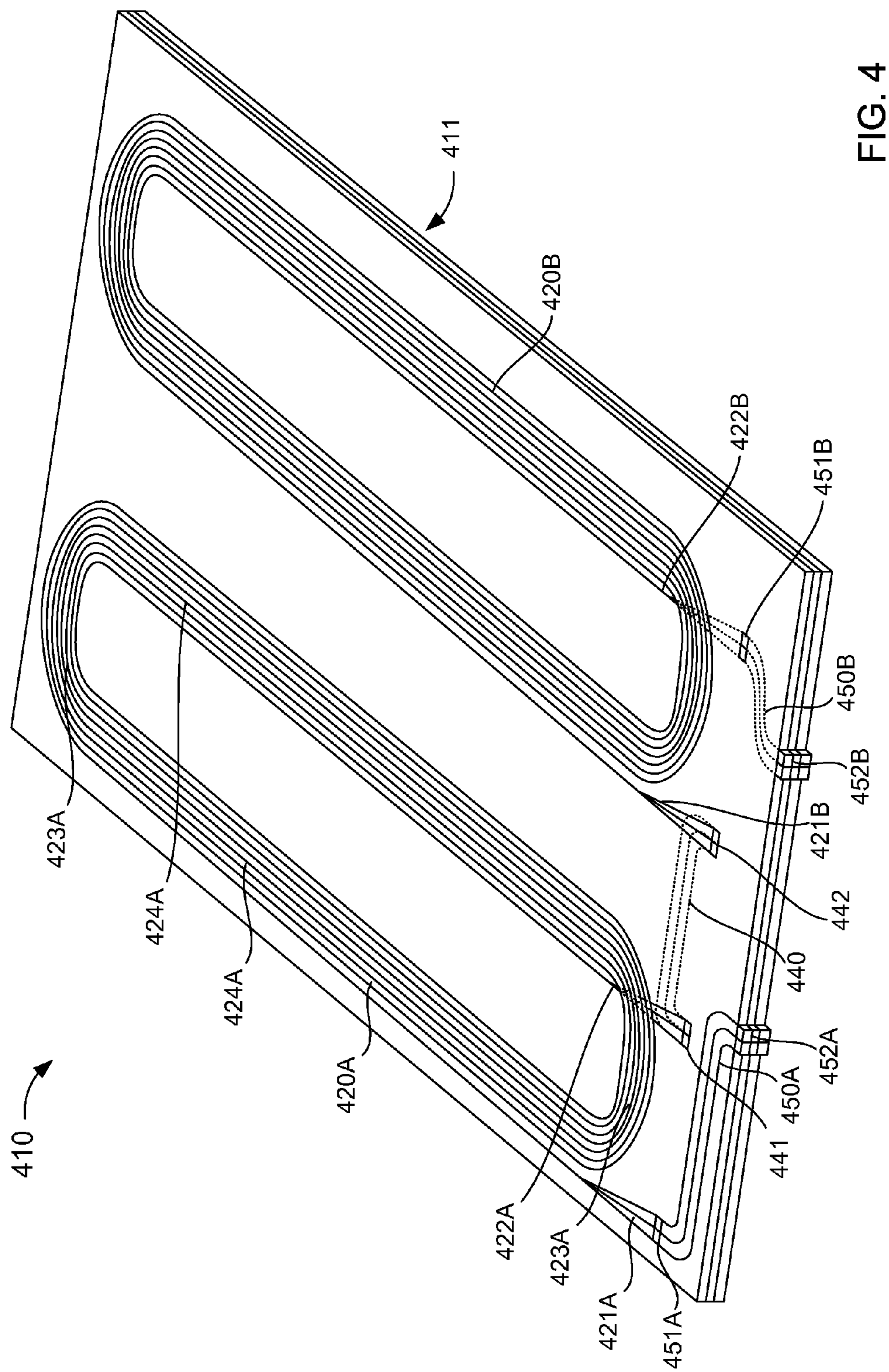
FIG. 4 is a schematic illustration of a laminated composite assembly according to an embodiment.

FIG. 4 is a schematic illustration of a laminated composite assembly 410 according to an embodiment. The laminated composite assembly 410 (also referred to herein as "assembly") can be included in an electromagnetic machine such as, for example, the machine structure 300 described above with reference to FIG. 3. The assembly 410 includes a first machine coil 420A, a second machine coil 420B, an internal connection 440, a first terminal connection 450A, and a second terminal connection 450B. As shown, the assembly 410 can be formed from any number of layers 411. More specifically, the assembly 410 can be formed from any number of conducting layers that are separated by a corresponding number of electrical insulators (e.g., insulating layers such as, non-core dielectric layers, cores, or pre-preg layers). The insulating layers can be any suitable configuration. For example, the insulating layers can be substantially similar to, or the same as, the non-core dielectric layers 170 and/or the cores 150, described above with reference to FIG. 1. Thus, the insulating layers can provide a base for the conducting layers of the assembly 410 as well as provide a degree of electrical isolation between adjacent conducting layers.

As shown in FIG. 4, the first machine coil 420A and the second machine coil 420B can be conductive traces etched from a conducting sheet of the assembly 410 (as described above). In some embodiments, the first machine coil 420A and the second machine coil 420B are disposed on a first conducting layer of the assembly 410. In other embodiments, the first machine coil 420A can be disposed on the first conducting layer and the second machine coil 420B can be disposed on a second conducting layer. The first machine coil 420A and the second machine coil 420B are each arranged in nonintersecting coils of conductive traces. In some embodiments, the first machine coil 420A and/or the second machine coil 420B can be substantially continuous and nonintersecting (e.g., a coiling conductive trace substantially disposed on the same layer). In other embodiments, any number of portions of the first machine coil 420A and/or any number of portions of the second machine coil 420B can be disposed on varying layers 411 of the assembly 410 and in electrical communication by one or more vias (not shown in FIG. 4), as described in further detail herein. The first machine coil 420A has a first end portion 421A that is electrically coupled to the first terminal connection 450A and a second end portion 422A that is electrically coupled to the internal connection 440. Similarly, the second machine coil 420B has a first end portion 421B that is electrically coupled to the internal connection 440 and a second end portion 422B that is electrically coupled to the second terminal connection 450B. While shown in FIG. 4 as collapsing into a single conductive trace, any suitable number of conductive traces of the first machine coil 420A can be electrically coupled to the first terminal connection 450A and/or the internal connection 440. For example, in some embodiments the first machine coil 420A can include multiple parallel conductive traces similar to the first terminal connection 450A and/or the second terminal connection 450B as described in further detail herein. Similarly any suitable number of conductive traces of the second machine coil 420B can be electrically coupled to the internal connection 440 and the second terminal connection 450B.

The internal connection 440 can be any suitable configuration. For example, as shown in FIG. 4, the internal connection 440 is an internal bus bar formed from one or more conductive traces. The internal connection 440 includes a first end portion 441 and a second end portion 442 that include and/or are electrically coupled to one or more vias (and/or electrical pads). The second end portion 422A of the first machine coil 420A is electrically coupled to the one or more vias to be placed in electrical communication with the first end portion 441 of the internal connection 440. Similarly, the first end portion 421B of the second machine coil 420B is electrically coupled to the one or more vias to be placed in electrical communication with the second end portion 442 of the internal connection 440. Thus, the first machine coil 420A is placed in electrical communication with the second machine coil 420B. As described in further detail herein, with the first end portion 441 and the second end portion 442 of the internal connection 440 coupled to the one or more vias, the internal connection 440 can be disposed on a different layer than the first machine coil 420A and/or the second machine coil 420B.

The first terminal connection 450A and the second terminal connection 450B can be any suitable configuration. For example, as shown in FIG. 4, the first terminal connection 450A and the second terminal connection 450B are conductive traces. The first terminal connection 450A includes a first end portion 451A and a second end portion 452A. The first end portion 451A of the first terminal trace 450A includes and/or is coupled to one or more vias (and/or electrical pads). Thus, the first end portion 421A of the first machine coil 420A is electrically coupled to the one or more vias to be placed in electrical communication with the first end portion 451A of the first terminal connection 450A. The second end portion 452A of the first terminal connection 450A includes and/or can be electrically coupled to an external connector. In some embodiments, the first terminal connection 450A and/or the external connector coupled thereto can be associated with a positive phase terminal. In this manner, the external connector can be electrically coupled to any suitable positive phase electrical connector, thereby placing the first machine coil 420A in electrical communication with any suitable electrical device (e.g., an electromagnetic machine such as the generator structure 300 described above with reference to FIG. 3).

The second terminal connection 450B includes a first end portion 451B and a second end portion 452B. In a similar manner as described above with reference to the first terminal connector 450A, the first end portion 451A of the second terminal connection 450B is in electrical communication with the second end portion 422B of the second machine coil 420B and the second end portion 452B of the second terminal connection 450B includes and/or can be electrically coupled to an external connector. Moreover, the second terminal connection 450B and/or the external connector coupled thereto are associated with a negative phase terminal and therefore, are electrically coupled to any suitable negative phase electrical connector. Thus, the first machine coil 420A and the second machine coil 420B are in electrical communication (e.g., via the internal connection 440) and are collectively in electrical communication with another electrical portion of any suitable electrical device (e.g., a collector included in a generator structure).

As described above, the internal connection 440, the first terminal connection 450A and the second terminal connection 450B can each be one or more conductive traces. In some instances, the internal connection 440, the first terminal connection 450A and/or the second terminal connection 450B can be formed from more than one conductive traces configured to reduce the formation of eddy currents associated with intersecting magnetic fields. As described above, while not shown in FIG. 4, the first machine coil 420A and/or the second machine coil 420B can also be formed from more than one conductive traces. Expanding further, by forming the internal connection 440, the first terminal connection 450A and the second terminal connection 450B from multiple conductive traces, the width of each conductive trace can be reduced, thereby reducing the reducing the magnitude of eddy currents that would otherwise form on one conductive trace having a width substantially the same as the combined width of the multiple conductive traces.

As described above, any portion of the first machine coil 420A, the second machine coil 420B, the internal connection 440, the first terminal connection 450A, and the second terminal connector 450B can be disposed on any suitable layer 411 of the assembly 410. For example, in some embodiment, the first machine coil 420A can be disposed on a first layer, the internal connection 440 can be disposed on a second layer, and the first terminal connection 450A can be disposed on a third layer. In such embodiments, the first machine coil 420A, the internal connection 440, and the first terminal connection 450A are placed in electrical communication by the vias (described above). In a similar manner, the second machine coil 420B, the internal connection 440, and the second terminal connection 450B can each be disposed on different layers and placed in electrical communication by the vias.

In some embodiments, portions of the first machine coil 420A and/or portions of the second machine coil 420B can be disposed on multiple layers. For example, in some embodiments, one or more of the layers of the first machine coil 420A can include, for example, operative portions 424A that extend between end turns 423A. In such embodiments, the operative portions 424A can be electrically coupled to one another and/or to the end turn 423A portions of the first machine coil 420A by vias and/or other suitable electrical interconnect(s). In some embodiments, one or more of the layers can include the end turns 423A that would otherwise intersect the internal connection 440, the first terminal connection 450A, and/or other portions of the first machine coil 420A. For example, as shown in FIG. 4, the second end portion 422A of the first machine coil 420A runs in a transverse direction across the end turn 423A. Therefore, in some embodiments, the end turns 423A can be disposed on a different layer 411 of the assembly 410 than the second end portion 422A. In a similar manner, the internal connection 440 can be disposed on a different layer 411 of the assembly 410 than the second end portion 422A of the first machine coil 420A and the first end portion 421B of the second machine coil 420B. Thus, the first machine coil 420A, the second machine coil 420B, the internal connection 440, the first terminal connection 450A, and the second terminal connector 450B can be disposed on various layers 411 of the assembly 410 to avoid intersections that would otherwise occur between the conductive traces.

With the internal connection 440 and the terminal connections 450A and 450B included on a layer (e.g., at least partially as conductive traces) of the assembly 410, external electrical connections can be reduced, thereby saving cost, weight, space, complexity and/or the like. Moreover, in embodiments where the assembly 410 can be included in, for example, an electromagnetic machine, the terminal connections 450A and 450B can form a power distribution conductive layer that is configured to distribute a voltage induced on or in the first machine coil 420A and/or second machine coil 420B. Therefore, with the terminal connections 450A and 450B including or being electrically coupled to an external connection, the assembly 410 can be substantially modular and the terminal connections 450A and 450B can distribute a voltage induced in the machine coils 420A and 420B to a portion of the electromagnetic machine (e.g., a collector and/or the like). For example, in some embodiments, multiple assemblies 410 can be arranged within an electromagnetic machine to form a segmented stator. In such embodiments, one or more assemblies 410 can be removed, in the event of a failure, and replaced with a new assembly 410 without removing the functioning assemblies 410.

Figure 5:
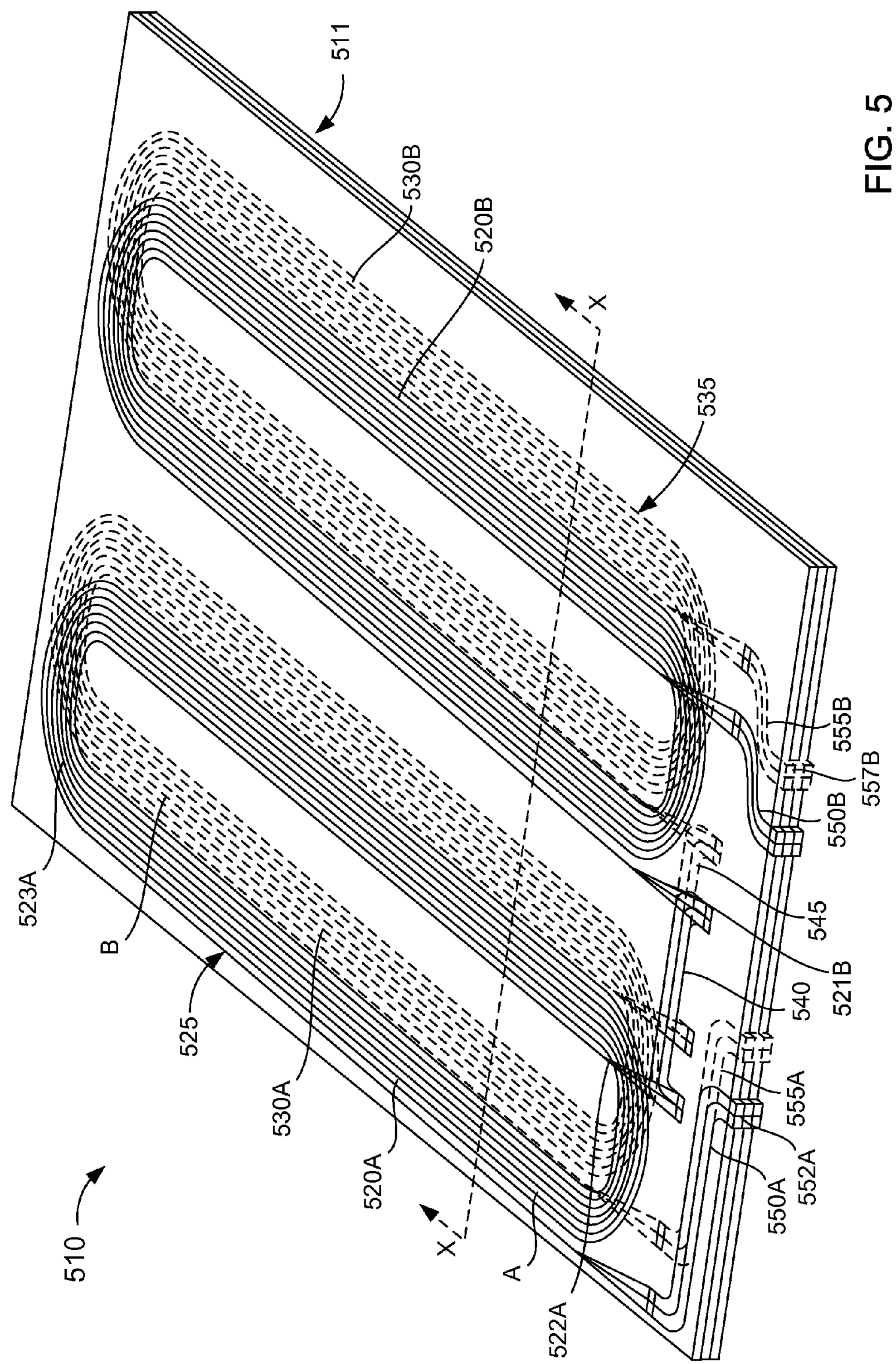
FIG. 5 is a schematic illustration of a multi-circuit laminated composite assembly according to an embodiment.
Figure 6:
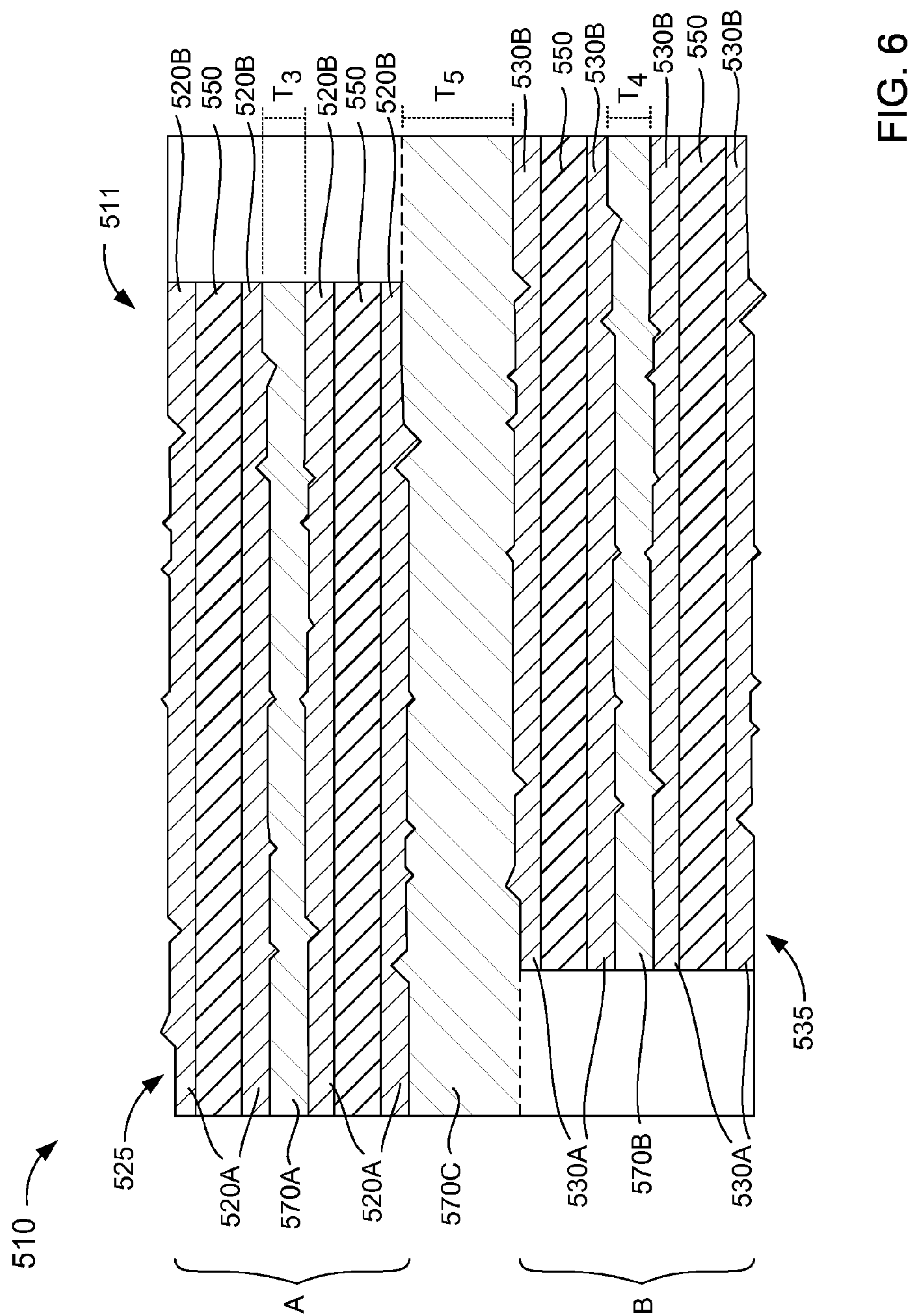
FIG. 6 is a cross-sectional view of the multi-circuit laminated composite assembly taken along the line X-X in FIG. 5.

While the assembly 410 shows a first machine coil 420A and a second machine coil 420B that are in electrical communication to transmit a flow of current in a single phase, in other embodiments, an assembly can include any suitable number of machine coils that can be arranged to transmit a flow of current in multiple phases. For example, FIGS. 5 and 6 illustrate a laminated composite assembly 510 according to an embodiment. The laminated composite assembly 510 (also referred to herein as "assembly") can be included in an electromagnetic machine such as, for example, the machine structure 300 described above with reference to FIG. 3. As shown, the assembly 510 can be formed from any number of layers 511. More specifically, the assembly 510 can be formed from any number of conducting layers that are separated by a corresponding number of electrical insulators (e.g., insulating layers such as, non-core dielectric layers, cores, and/or pre-preg layers). The insulating layers can be any suitable configuration. For example, as shown in FIG. 6, the conducting layers are separated by a core 550 and/or a non-core dielectric layer 570A, 570B, or 570C. The core 550 and the non-core dielectric layers 570A, 570B, and 570C can be substantially similar to or the same as the core 150 and the non-core dielectric layer 170, respectively, described above with reference to FIG. 1. Thus, the cores 550 and/or the non-core dielectric layers 570A, 570B, and 570C can provide a base for the conducting layers of the assembly 510 as well as provide a degree of electrical isolation between adjacent conducting layers, as described in further detail herein.

As shown in FIG. 5, the assembly 510 includes a first set of conductors 525 and a second set of conductors 535. The first set of conductors 525 and the second set of conductors 535 are, for example, conductive traces etched from a conducting sheet (e.g., a conducting layer) of the assembly 510 (as described in detail above with reference to FIG. 1). As described in further detail herein, the first set of conductors 525 is associated with a first electrical phase A (also referred to herein as "first phase") and the second set of conductors 535 is associated with a second electrical phase B (also referred to herein as "second phase"). The first set of conductors 525 includes a first machine coil 520A, a second machine coil 520B, first internal connection 540, a first terminal connection 550A, and a second terminal connection 550B. Similarly, the second set of conductors 535 includes a third machine coil 530A, a fourth machine coil 530B, a second internal connection 545, a third terminal connection 555A, and a fourth terminal connection 555B. In some embodiments, the second set of conductors 535 can be substantially similar in form and function to the first set of conductors 525 but shifted (e.g., phase shifted and/or physically shifted) relative to the assembly 510 to transmit the second phase B. Thus, the discussion of the first set of conductors 525 applies to the second set of conductors 535 unless explicitly described as being different. Moreover, the first machine coil 520A, the second machine coil 520B, the first internal connection 540, the first terminal connection 550A, and the second terminal connection 550B are substantially similar in form and function to the first machine coil 420A, the second machine coil 420B, the first internal connection 440, the first terminal connection 450A, and the second terminal connection 450B described with reference to FIG. 4. Thus, portions of the first machine coil 520A, the second machine coil 520B, the first internal connection 540, the first terminal connection 550A, and the second terminal connection 550B are not described in further detail below.

As shown in FIG. 5, the first machine coil 520A and the second machine coil 520B can be substantially disposed on a first conducting layer of the assembly 510. In other embodiments, the first machine coil 520A can be disposed on the first conducting layer and the second machine coil 520B can be disposed on a second conducting layer. The first machine coil 520A and the second machine coil 520B are each arranged in nonintersecting coils of conductive traces (as described above). In some embodiments, any number of portions of the first machine coil 520A and/or the second machine coil 520B can be disposed on varying layers 511 of the assembly 510 and in electrical communication by one or more vias (not shown in FIG. 5). The first machine coil 520A has a first end portion that is electrically coupled to the first terminal connection 550A and a second end portion that is electrically coupled to the internal connection 540. Similarly, the second machine coil 520B has a first end portion that is electrically coupled to the internal connection 540 and a second end portion that is electrically coupled to the second terminal connection 550B.

The internal connection 540 can be, for example, an internal bus bar formed from one or more conductive traces. As described above, the internal connection 540 is electrically coupled (either directly or indirectly by one or more vias) to the second end portion of the first machine coil 520A. Similarly, the first end portion of the second machine coil 520B is electrically coupled (either directly or indirectly) to the internal connection 540. Thus, the first machine coil 520A is placed in electrical communication with the second machine coil 520B. As described in further detail herein, in some embodiments, the internal connection 540 can be indirectly coupled to the first machine coil 520A and the second machine coil 520B by one or more vias. Thus, the internal connection 540 can be disposed on a different layer than the first machine coil 520A and/or the second machine coil 520B.

As shown in FIG. 5, the first terminal connection 550A and the second terminal connection 550B are conductive traces disposed on, or etched from, a conducting layer of the assembly 510. A first end portion of the first terminal connection 550A is electrically coupled (either directly or indirectly by one or more vias) to the first end portion of the first machine coil 520A. A second end portion of the first terminal connection 550A includes and/or can be electrically coupled to an external connector. In some embodiments, the first terminal connection 550A and/or the external connector coupled thereto are associated with a positive terminal of the phase A. In this manner, the external connector can be electrically coupled to any suitable electrical connector associated with the positive terminal of the phase A, thereby placing the first machine coil 520A in electrical communication with any suitable electrical device (e.g., an electromagnetic machine such as the generator structure 300 described above with reference to FIG. 3).

Similarly, a first end portion of the second terminal connection 550B is in electrically coupled (either directly or indirectly by one or more vias) to the second end portion of the second machine coil 520B. A second end portion of the second terminal connection 550B includes and/or can be electrically coupled to an external connector. The second terminal connection 550B and/or the external connector coupled thereto can be associated with a negative terminal of the phase A. In this manner, the external connector can be electrically coupled to any suitable electrical connector associated with the negative terminal of the phase A. Thus, the first machine coil 520A and the second machine coil 520B are in electrical communication (e.g., via the first internal connection 540) and are collectively in electrical communication with another electrical portion included in any suitable electrical device (e.g., a collector of a generator structure) associated with the phase A. In a similar manner, the third machine coil 530A and the fourth machine coil 530B are in electrical communication (e.g., via the second internal connection 545) and are collectively in electrical communication with another electrical portion included in the electrical device that is associated with the phase B.

As described above, any portion of the first set of conductors 525 and/or any portion of the second set of conductors 535 can be disposed on various layers of the assembly 510. For example, in some embodiment, the first machine coil 520A can be disposed on a first layer, the internal connection 540 can be disposed on a second layer, and the first terminal connection 550A can be disposed on a third layer. In such embodiments, the first machine coil 520A, the internal connection 540, and the first terminal connection 550A are placed in electrical communication by the vias (described above). In a similar manner, the second machine coil 520B, the internal connection 540, and the second terminal connection 550B can each be disposed on the first layer, the second layer, and the third layer, respectively, and placed in electrical communication by the vias.

In some embodiments, the first machine coil 520A and/or the second machine coil 520B can be disposed on multiple layers. In some embodiments, one or more of the layers of the first machine coil 520A can include, for example, end turns 523A that would otherwise overlap the internal connection 540, the first terminal connection 550A, and/or other portions of the first machine coil 520A. For example, as shown in FIG. 5, the second end portion 522A of the first machine coil 520A runs in a transverse direction across the end turn 523A. Therefore, in some embodiments, the end turns 523A can be disposed on a different layer 511 of the assembly 510 than the second end portion 522A. In a similar manner, the internal connection 540 can be disposed on a different layer 511 of the assembly 510 than the second end portion 522A of the first machine coil 520A and the first end portion 521B of the second machine coil 520B. Thus, the first machine coil 520A, the second machine coil 520B, the internal connection 540, the first terminal connection 550A, and the second terminal connector 550B can be disposed on various layers 511 of the assembly 510 to avoid intersections that would otherwise occur between the conductive traces.

For example, as shown in FIG. 6, the first machine coil 520A and the second machine coil 520B can each be disposed on four conductive layers and separated by electrical insulators (e.g., the core 550 and/or the non-core dielectric layer 570A). In some embodiments, the assembly 510 can be comprised of a set of layers that include a first conducting layer and a second conducting layer separated by the core 550. In such embodiments, the set of layers can be stacked and laminated to form the assembly 510. In this manner, the core 550 and the non-core dielectric layer 570A can be substantially similar in form and function. Accordingly, a degree of electrical isolation provided or defined by the core 550 and/or the non-core dielectric layer 570A can be based, at least partially, on a voltage stress (defined above) between adjacent conductors. For example, as shown in FIG. 6, the non-core dielectric layer 570A has a thickness $T_3$ that is associated with a given voltage stress. Thus, the thickness $T_3$ of the non-core dielectric layer 570A is sufficient to electrically isolate adjacent conductors. While not shown, the core 550 can have a substantially similar thickness $T_3$ sufficient to electrically isolate adjacent conductors. While being described as being substantially similar in form and function, in some embodiments, the core 550 can form a base configured to support the conductive layers while the non-core dielectric layer 570A can be formed from a pre-preg material that can be heated to flow between the conductive layers and allowed to cool and/or cure to form a substantially rigid (e.g., hardened) non-core dielectric layer. In such embodiments, the core 550 and the dielectric material 570A can be configured to provide a similar degree of electrical isolation.

Similarly, the third machine coil 530A and the fourth machine coil 530B can each be disposed on four conductive layers and separated by the core 550 and/or the non-core dielectric layer 570B. Accordingly, a degree of electrical isolation provided or defined by the core 550 and/or the non-core dielectric layer 570B can be based, at least partially, on a voltage stress (defined above) between adjacent conductors. For example, as shown in FIG. 6, the non-core dielectric layer 570B has a thickness $T_4$ that is associated with a given voltage stress. Thus, the thickness $T_4$ of the non-core dielectric layer 570B is sufficient to electrically isolate adjacent conductors. While not shown, the core 550 can have a substantially similar thickness as the thickness $T_4$. In some embodiments, the thickness $T_3$ of the non-core dielectric layer 570A and thickness $T_4$ of the non-core dielectric layer 570B can be substantially similar. In other embodiments, the thickness $T_3$ of the non-core dielectric layer 570A can be thicker than the thickness $T_4$ of the non-core dielectric layer 570B (or vice versa). With the first machine coil 520A and the second machine coil 520B each associated with the phase A, the thickness $T_3$ of the non-core dielectric layer 570A (and/or the thickness of the core 550) can be based on the possible voltage stress between the conductors. Similarly, with the third machine coil 530A and the fourth machine coil 530B each associated with the phase B, the thickness $T_4$ of the non-core dielectric layer 570B (and/or the thickness of the core 550) can be based on the possible voltage stress between the conductors.

Figure 7:
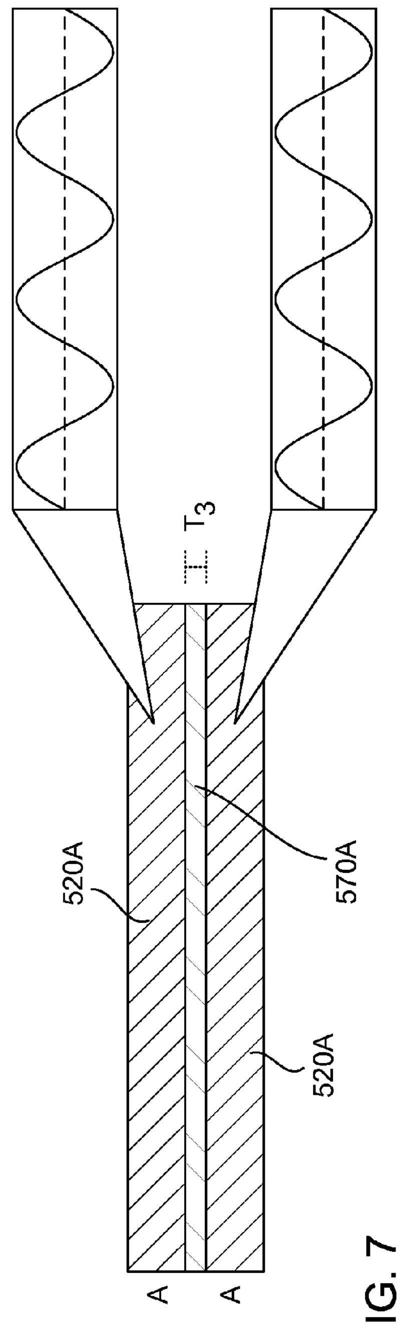
FIG. 7 is a schematic illustration of a first voltage and a second voltage associated with a common phase of the multi-circuit laminated composite assembly of FIG. 5.

The assembly 510 includes the non-core dielectric layer 570C disposed between a conductor (e.g., 520A and/or 520B) associated with the phase A and a conductor (e.g., 530A and/or 530B) associated with the phase B. As shown, the thickness $T_5$ of the non-core dielectric layer 570C disposed between adjacent conductors having a voltage of different phases is larger than the thickness $T_3$ of the non-core dielectric layer 570A and/or the thickness $T_4$ of the non-core dielectric layer 570B. Expanding further as shown in FIG. 7, the sinusoidal waveforms of the voltages carried on adjacent conducting layers of the first machine coil 520A and associated with the phase A are substantially aligned. Thus, in some instances where the amplitude of the waveform is substantially constant, the voltages are substantially equal. Moreover, when associated with the same phase (e.g., the phase A) the voltage stress between the adjacent conducting layers of the first machine coil 520A can be relatively small as the change in voltages (e.g., due to alternating current) are substantially aligned. In this manner, the thickness $T_3$ of the non-core dielectric layer 570A can be relatively small.

Figure 8:
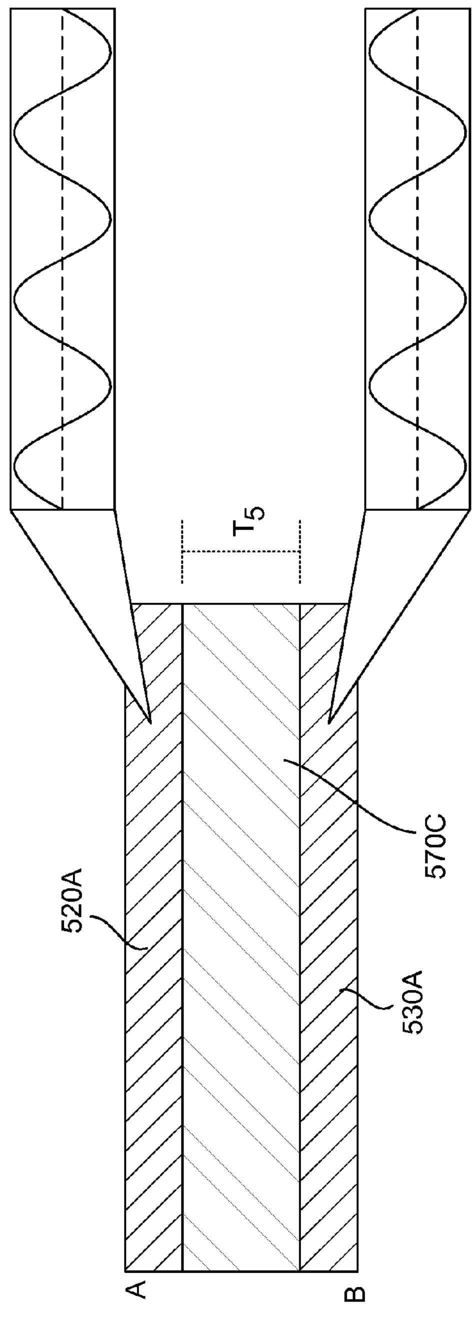
FIG. 8 is a schematic illustration of a first voltage associated with a first phase and a second voltage associated with a second phase of the multi-circuit laminated composite assembly of FIG. 5.

Conversely, as shown in FIG. 8, the sinusoidal waveform of the voltage carried on a conductive layer of the first machine coil 520A (i.e., a conductive layer associated with the phase A) and the sinusoidal waveform of the voltage on a conducting layer of the third machine layer 530A (i.e., a conducting layer associated with the phase B) are not aligned. When the conductive layer of the first machine coil 520A and the conductive layer of the third machine coil 530A are associated with different phases (e.g., phase A and phase B, respectively) the voltage stress between the adjacent conductive layers can be relatively large as the change in voltages (e.g., due to alternating current) are not aligned. For example, in some instances, the conductive layer of the first machine coil 520A can carry a relatively large negative voltage at a give time while the conductive layer of the third machine coil 530A is carrying a relatively large positive voltage at the given time. In this manner, the voltage stress (i.e., a difference between instantaneous voltages) between adjacent conductive layers carrying different phases can be significantly larger than the voltage stress between adjacent conductive layers carrying a similar phase. Thus, the voltage on each layer is not substantially equal, and the thickness $T_5$ of the non-core dielectric layer 570C is larger than the thickness $T_3$ of the non-core dielectric layer 570A to maintain the desired electrical isolation between the layers 520A and 530A.

Although the first non-core dielectric layer 570A is described above as having the thickness $T_3$ and the third non-core dielectric layer 570C is described as having the thickness $T_5$ that is a different that the thickness $T_3$, in other embodiments, the non-core dielectric layer 570A and 570C can have a similar thickness while providing different degrees of electrical isolation. For example, in some embodiments, the first non-core dielectric layer 570A can be formed from a first dielectric material having a first dielectric strength (e.g., FR-4 with a dielectric strength of 20 kV/mm) and the third non-core dielectric layer 570C can be formed from a second dielectric material having a second dielectric strength that is greater than the first dielectric strength (e.g., PTFE with a dielectric strength of 60 MV/mm). In other embodiments, a suitable degree of electrical isolation can be achieved by a combination of an increase in thickness of the non-core dielectric layer and forming the non-core dielectric layer from a material having a greater dielectric strength. Thus, a balance of an increase in thickness and an increase in dielectric strength can reduce the overall thickness of the assembly 510 while reducing the cost of the assembly 510 that would otherwise be greater from the use exotic dielectric materials with a large dielectric strength.

The arrangement of the assembly 510 is such that in some embodiments, the assembly 510 can be disposed within a multi-phase electromagnetic machine. Furthermore, with the internal connections (540 and 545) and the terminal connections (550A, 550B, 555A, and 555B) included on a layer (e.g., at least partially as conductive traces) of the assembly 510, external electrical connections can be reduced, thereby saving cost, weight, space, and/or the like. The arrangement of the terminal connections (550A, 550B, 555A, and 555B) is such that the assembly 510 is substantially modular. For example, in some embodiments, multiple assemblies 510 can be arranged within an electromagnetic machine to form a segmented stator. In such embodiments, one or more assemblies 510 can be removed, in the event of a failure, and replaced with a new assembly 510 without removing the functioning assemblies 510.

Although the assembly 510 is described as being associated with the first phase A and the second phase B, in other embodiments, an assembly can be associated with any suitable number of phases, such as, for example, three, or more. In such embodiments, a set of conductors associated with each phase can be separated by a non-core dielectric layer having a thickness that is larger than a thickness of a non-core dielectric layer disposed between adjacent conductors associated with the same phase (as described in detail above with reference to FIGS. 5-8). While the first phase A and the second phase B are shown as being 180° out of phase, in some embodiments, the first phase A and the second phase can be disposed at any suitable phase angle. For example, in some embodiments, an assembly can include conductive layers configured to carry a voltage with a first phase, a second phase, and a third phase. In such embodiments, the first phase, the second phase, and the third phase can be disposed at 120° relative to one another.

Figure 9:
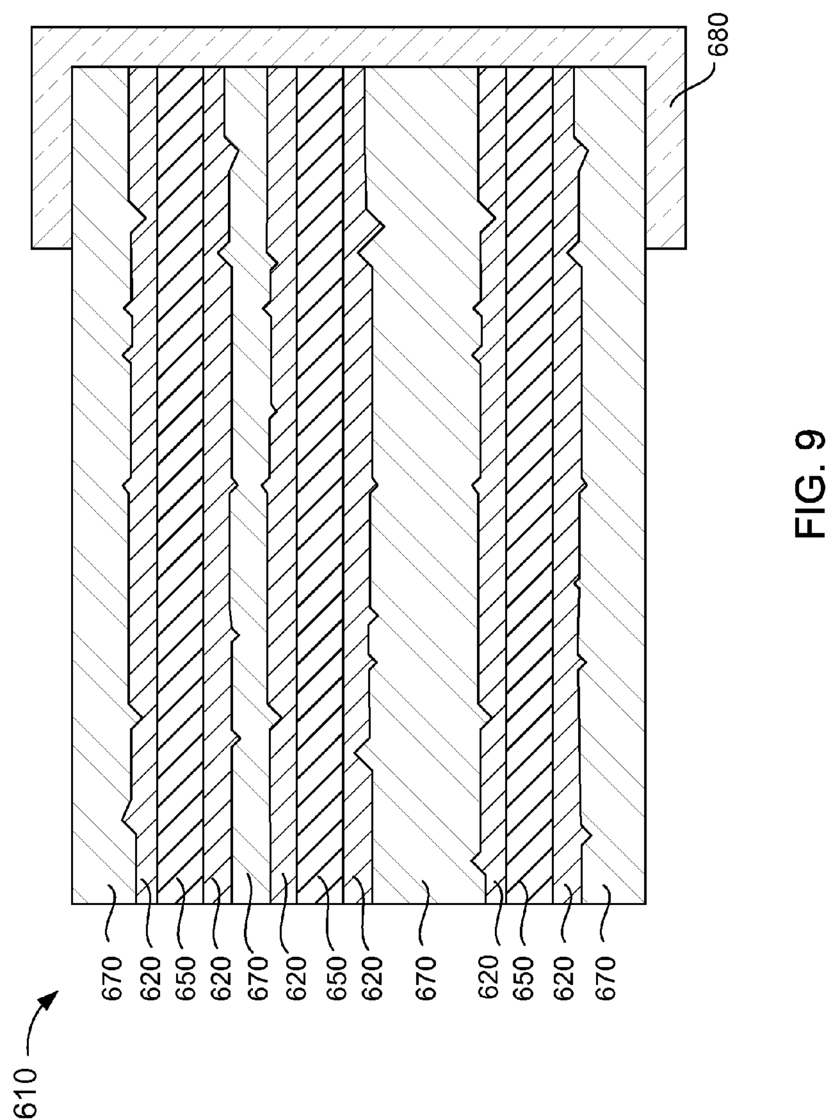
FIG. 9 is a schematic illustration of a multi-circuit laminated composite assembly according to an embodiment.

Although the assembly 110 (FIG. 1), the assembly 410 (FIG. 4), and the assembly 510 (FIGS. 5 and 6) are shown as including a top layer and a bottom layer including a conductor or conductive trace, in other embodiments, an assembly can include a top layer and a bottom layer formed from an insulating material (e.g., a non-core dielectric layer and/or a core). For example, FIG. 9 is a schematic illustration of a laminated composite assembly 610 according to an embodiment. As shown, the laminated composite assembly 610 (also referred to herein as "assembly") includes a set of conductors 620 that are each separated by a corresponding set of electrical insulators (e.g., insulating layers such as a non-core dielectric layer 670 and/or a core 650). The conductors 620 can be, for example, a set of conductive traces such as, machine coils, internal connections, terminal connections, shielding conductors, a signal carrying conductor, or the like). In this manner, the conductive layers 620 and the electrical insulating layers (e.g., the non-core dielectric layers 670 and/or the core 650 can be stacked to form the laminated composite assembly 610.

In some embodiments, the assembly 610 is substantially similar in form and function to the assembly 510 described above with reference to FIGS. 5-8. Thus, the assembly 610 is not described in further detail herein. The assembly 610 can differ from the assembly 510, however, by forming the assembly 610 with outer non-core dielectric layer 670. In this manner, the assembly 610 can be suitable for use within, for example, an electromagnetic machine (such as the machine structure 300 shown and described with reference to FIG. 3). For example, in some embodiments, the assembly 610 can form at least a portion of a stator and the electromagnetic machine (not shown in FIG. 9) can include a clamp 680 configured to retain the assembly 610 in a fixed position relative to the electromagnetic machine. In such embodiments, the electrical insulator (e.g., the dielectric layer 670) on the outer layers of the assembly 610 can electrically isolate the conductors 620 of the assembly 610 from the clamp 680 that retains the relative position of the assembly 610. More specifically, in some embodiments, that the clamp 680 (or other suitable fastener) can be formed from a conductive material such as, for example, steel. Thus, the outer non-core dielectric layers 670 can be configured to electrically isolate the conductive layers 620 of the assembly 610 from the conductive clamp 680 and can be selected based on a voltage stress between a conductive layer 620 of the assembly 610 and the clamp 680.

In some instances, a first end portion of the clamp 680 can carry a first voltage and a second end portion of the clamp 680 can carry a second voltage, different than the first voltage. In such embodiments, the thickness of the outer non-core dielectric layers 670 can be varied based at least in part on the voltage stress between the clamp 680 and the conductors 620 of the assembly 610. Expanding further, the first end portion of the clamp 680 and a first conductor 620 can define a first voltage stress and the degree of electrical isolation of the non-core dielectric layer 670 disposed therebetween (e.g., the thickness and/or dielectric strength) can be based at least in part on the first voltage stress. Similarly, the second end portion of the clamp 680 and a second conductor 620 can define a second voltage stress, different from the first voltage stress, and the degree of electrical isolation of the non-core dielectric layer 670 disposed therebetween (e.g., the thickness and/or dielectric strength) can be based at least in part on the second voltage stress.

Although the assemblies 210, 410, and 510 are shown and described above as including machine coils that are in an electrically series configuration, in other embodiments, an assembly can include two or more machine coils that are arranged in an electrically parallel configuration. In other embodiments, an assembly can include a set of machine coils that can include at least two machine coils in an electrically series configuration and at least two machine coils in an electrically parallel configuration.

While various embodiments have been described above, it should be understood that they have been presented by way of example only, and not limitation, and as such, various changes in form and/or detail may be made. Any portion of the apparatus and/or methods described herein may be combined in any suitable combination, unless explicitly expressed otherwise. Where methods and/or schematics described above indicate certain events occurring in certain order, the ordering of certain events and/or flow patterns may be modified. Additionally, certain events may be performed concurrently in parallel processes when possible, as well as performed sequentially.

Although various embodiments have been described as having particular features and/or combinations of components, other embodiments are possible having a combination of any features and/or components from any of embodiments as discussed above.

What is claimed is:

1. An apparatus, comprising:

a layer of a laminated composite assembly, the layer having a first conductor, the first conductor having a first side and a second side disposed opposite the first side;

a first electric insulator disposed between the first side of the first conductor and a second conductor electrically coupled to the first conductor such that a voltage associated with the first conductor is substantially equal to a voltage associated with the second conductor, the first electric insulator providing a first degree of electrical isolation between the first conductor and the second conductor, the first electric insulator being selected to achieve the first degree of electrical isolation based on a voltage stress between the first conductor and the second conductor; and a second electric insulator disposed between the second side of the first conductor and a third conductor electrically isolated within the laminated composite assembly from the first conductor and the second conductor, the third conductor associated with a voltage substantially different than the voltage associated with the first conductor such that a difference between the voltage associated with the first conductor and the voltage associated with the third conductor defines a voltage stress between the first conductor and the third conductor, the second electric insulator providing a second degree of electrical isolation between the first conductor and the third conductor, the second electric insulator being selected to achieve the second degree of electrical isolation based on the voltage stress between the first conductor and the third conductor, the second degree of electrical isolation being different than the first degree of electrical isolation.

2. The apparatus of claim 1, wherein the first electric insulator has a first thickness, the second electric insulator has a second thickness different from the first thickness, the first degree of electrical isolation being based at least in part on the first thickness, the second degree of electrical isolation being based at least in part on the second thickness.

3. The apparatus of claim 1, wherein the first electric insulator has a first dielectric strength, the second electric insulator has a second dielectric strength different from the first dielectric strength, the first degree of electrical isolation being based at least in part on the first dielectric strength, the second degree of electrical isolation being based at least in part on the second dielectric strength.

4. The apparatus of claim 1, wherein the first conductor includes at least one of an end turn of a machine coil, a power distribution conductor or an internal machine coil interconnection.

5. The apparatus of claim 1, wherein the voltage stress between the first conductor and the third conductor is associated with an electrical phase-to-phase voltage of a multi-phase machine winding.

6. The apparatus of claim 1, wherein the first conductor is an internal bus bar that electrically couples a first machine coil having the voltage associated with the first conductor with a second machine coil having the voltage associated with the first conductor.

7. The apparatus of claim 1, wherein the first conductor includes a plurality of non-intersecting electrical paths.

8. The apparatus of claim 1, wherein at least one of the second conductor and the third conductor are part of a mechanical structure configured to substantially retain the laminated composite assembly.

9. An apparatus, comprising:

a laminated composite assembly having a first plurality of layers and a second plurality of layers, each layer from the first plurality of layers having a conductor electrically coupled to a conductor of each remaining layer from the first plurality of layers to define a first electrical circuit, associated with a first voltage, each layer from the second plurality of layers having a conductor electrically coupled to a conductor of each remaining layer from the second plurality of layers to define a second electrical circuit (1) electrically isolated within the laminated composite assembly from the first electrical circuit and (2) associated with a second voltage different from the first voltage, the laminated composite assembly having a first electric insulator that provides a first degree of electrical isolation between the conductor of a first layer from the first plurality of layers and the conductor of a second layer from the first plurality of layers, the first degree of electrical isolation associated with the first voltage, the laminated composite assembly having a second electric insulator that provides a second degree of electrical isolation, different from the first degree of electrical isolation, between the conductor of a third layer from the first plurality of layers and the conductor of a layer from the second plurality of layers, the second degree of electrical isolation associated with a difference between the first voltage and the second voltage.

10. The apparatus of claim 9, wherein the first electric insulator has a first thickness, the second electric insulator has a second thickness different from the first thickness, the first degree of electrical isolation being based at least in part on the first thickness, the second degree of electrical isolation being based at least in part on the second thickness.

11. The apparatus of claim 9, wherein the first electric insulator has a first dielectric strength, the second electric insulator has a second dielectric strength different from the first dielectric strength, the first degree of electrical isolation being based at least in part on the first dielectric strength, the second degree of electrical isolation being based at least in part on the second dielectric strength.

12. The apparatus of claim 9, wherein the conductor of the first layer from the first plurality of layers includes at least one of an end turn of a machine coil, a power distribution conductor or an internal machine coil interconnection.

13. The apparatus of claim 9, wherein the first electrical circuit and the second electrical circuit are associated with different phases of a multi-phase machine winding.

14. The apparatus of claim 10, wherein the second thickness is greater than the first thickness.

15. The apparatus of claim 9, wherein the conductor of the first layer from the first plurality of layers is an internal bus bar that electrically couples a first machine coil associated with the first electrical circuit with a second machine coil associated with the first electrical circuit.

16. The apparatus of claim 9, wherein the conductor of the first layer from the first plurality of layers includes a plurality of non-intersecting electrical traces.

17. An apparatus, comprising:

a first machine coil associated with a first phase of a multi-phase set of machine windings, the first machine coil being at least one electrical path on a first layer of a laminated composite assembly;

a second machine coil associated with the first phase of the multi-phase set of machine windings, the second machine coil being (1) at least one electrical path on a second layer of the laminated composite assembly and (2) electrically connected to the first machine coil via an internal connection such that the second machine coil is associated with a voltage substantially similar to a voltage associated with the first machine coil, the internal connection being at least one electrical path on the laminated composite assembly;

a third machine coil associated with a second phase of the multi-phase set of machine windings, the third machine coil being (1) at least one electrical path on a third layer of the laminated composite assembly and (2) electrically isolated within the laminated composite assembly from the first machine coil and the second machine coil, the third machine coil configured to be associated with a voltage different from the voltage associated with the first machine coil;

a first electric insulator disposed between the first layer and the second layer, the first electric insulator providing a first degree of electrical isolation based on a voltage stress between at least a portion of the first machine coil and at least a portion of the second machine coil; and a second electric insulator disposed between the second layer and the third layer of the laminated composite assembly, the second electric insulator providing a second degree of electrical isolation based on a voltage stress between at least a portion of the second machine coil and at least a portion of the third machine coil, the second degree of electrical isolation being different from the first degree of electrical isolation, the laminated composite assembly forming at least a portion of a segment included in a segmented machine.

18. The apparatus of claim 17, wherein the internal connection electrically couples the first machine coil and the second machine coil in an electrically parallel configuration.

19. The apparatus of claim 17, wherein the internal connection is at least one of an electrical trace on a layer of the laminated composite assembly or an electrical via electrically coupling a plurality of layers of the laminated composite assembly.

20. The apparatus of claim 17, wherein the internal connection is arranged to electrically couple the first machine coil and the second machine coil in an electrically series configuration.

21. The apparatus of claim 17, wherein the internal connection includes a plurality of parallel electrical paths.

22. The apparatus of claim 17, wherein the internal connection is a first internal connection, the apparatus further comprising:

a fourth machine coil configured to be associated with the second phase of the multi-phase set of machine windings, the fourth machine coil being (1) at least one electrical path on a fourth layer of the laminated composite assembly and (2) electrically connected to the third machine winding via a second internal connection such that the fourth machine coil is configured to be associated with a voltage substantially similar to the voltage associated with the third machine coil, the second internal connection being at least one electrical path on the laminated composite assembly.

* * * * *

UNITED STATES PATENT AND TRADEMARK OFFICE

CERTIFICATE OF CORRECTION

PATENT NO. : 8,785,784 B1
APPLICATION NO. : 13/799998
DATED : July 22, 2014
INVENTOR(S) : James D. Duford et al.

It is certified that error appears in the above-identified patent and that said Letters Patent is hereby corrected as shown below:

IN THE CLAIMS:

Column 22, line 23 (line 9 of claim 22): "machine winding via a second internal connection such-" should read "machine coil via a second internal connection such-".

Signed and Sealed this
Sixth Day of January, 2015

Michelle K. Lee
*Deputy Director of the United States Patent and Trademark Office*